(12) United States Patent
Maeda et al.

(10) Patent No.: US 9,925,618 B2
(45) Date of Patent: Mar. 27, 2018

(54) LASER PROCESSING APPARATUS

(71) Applicant: DISCO CORPORATION, Tokyo (JP)

(72) Inventors: Tsutomu Maeda, Tokyo (JP); Kiyoshi Ohsuga, Tokyo (JP)

(73) Assignee: Disco Corporation, Tokyo (JP)

(*) Notice: Subject to any disclaimer, the term of this patent is extended or adjusted under 35 U.S.C. 154(b) by 301 days.

(21) Appl. No.: 14/842,272

(22) Filed: Sep. 1, 2015

(65) Prior Publication Data

US 2016/0074959 A1 Mar. 17, 2016

(30) Foreign Application Priority Data

Sep. 12, 2014 (JP) ................................. 2014-186235

(51) Int. Cl.
| | | |
|---|---|---|
| B23K 26/03 | (2006.01) | |
| H01L 21/68 | (2006.01) | |
| B23K 26/00 | (2014.01) | |
| B23K 26/53 | (2014.01) | |
| H01L 21/67 | (2006.01) | |
| B23K 26/402 | (2014.01) | |
| B23K 103/00 | (2006.01) | |

(52) U.S. Cl.
CPC ........ B23K 26/0057 (2013.01); B23K 26/032 (2013.01); B23K 26/402 (2013.01); B23K 26/53 (2015.10); H01L 21/67092 (2013.01); H01L 21/681 (2013.01); *B23K 2203/56* (2015.10)

(58) Field of Classification Search
CPC ............ B23K 26/0057; B23K 26/0063; B23K 26/364; B23K 26/53; B23K 26/57; H01L 21/67092; H01L 21/681
See application file for complete search history.

(56) References Cited

U.S. PATENT DOCUMENTS

| | | | | |
|---|---|---|---|---|
| 6,591,154 B2* | 7/2003 | Haight | ............. | H01L 21/67288 438/12 |
| 7,380,322 B2* | 6/2008 | von Detten | ............ | H01R 43/28 29/33 M |
| 9,423,248 B2* | 8/2016 | Lu | ........................ | G01B 11/272 |
| 9,530,695 B2* | 12/2016 | Maeda | ............. | H01L 21/67092 |
| 2005/0205778 A1* | 9/2005 | Kitai | .................... | B23K 26/032 250/309 |

FOREIGN PATENT DOCUMENTS

| | | |
|---|---|---|
| JP | 2005-086161 | 3/2005 |
| JP | 2010-123723 | 6/2010 |

* cited by examiner

*Primary Examiner* — Robert B Davis

(74) *Attorney, Agent, or Firm* — Greer Burns & Crain Ltd.

(57) ABSTRACT

A laser processing apparatus is provided wherein a laser beam of a wavelength which passes through a wafer having a surface on which a plurality of devices are disposed is irradiated along a schedule division line to separate the adjacent devices from each other to form a modification layer which continuously extends in a given length in the inside of the wafer. A mark portion is displayed in an overlapping relationship with a picked up image obtained by image pickup of a wafer on a display unit. If the mark portion is moved to a desired position of the picked up image displayed on the display unit, then coordinates which correspond to the desired position of the picked up image are stored as a start point or an end portion of a scheduled division line, along which the modification layer is to be formed, into a storage unit.

1 Claim, 6 Drawing Sheets

LASER PROCESSING APPARATUS

BACKGROUND OF THE INVENTION

Field of the Invention

The present invention relates to a laser processing apparatus which irradiates a laser beam for forming a modification layer serving as a start point of division on a wafer.

Description of the Related Art

In order to divide a wafer, on which devices such as an IC (Integrated Circuit) and so forth are formed, into a plurality of chips, a processing method for a wafer wherein a laser beam is focused on the inside of the wafer to form a modification layer serving as a start point of division has been proposed (refer to, for example, Japanese Patent Laid-Open No. 2005-86161). With this processing method, it is possible to reduce the cutting margin (cutting width) and suppress chipping (chipping of the chip) in comparison with conventional processing methods which uses a cutting blade. Further, with this processing method, also it is possible to process a wafer without using water.

Incidentally, in a laser processing apparatus used for the processing method described above, it is possible to easily switch between irradiation and non-irradiation of a laser beam. Therefore, a method has been proposed which takes advantage of this characteristic of the laser working apparatus to process a wafer of the so-called multi-project type in which devices of different shapes and different sizes are provided in a mixed state (refer to, for example, Japanese Patent Laid-Open No. 2010-123723).

SUMMARY OF THE INVENTION

Where a wafer whose scheduled division line is interrupted in the middle like a wafer of the multi-project type described above is to be processed, it is necessary to appropriately switch between irradiation and non-irradiation of a laser beam to irradiate the laser beam only upon a desired region. Therefore, in a laser processing apparatus, a processing condition including information of a region upon a laser beam is to be irradiated (for example, coordinates of a start point and an end point) for each wafer. However, the processing condition in such a case as just described is complicated in comparison with a processing condition for general wafers which depend upon the diameter and so forth of the wafer, and cannot be set readily. Therefore, the possibility that a wrong working condition may be set to a laser processing apparatus is high.

Accordingly, the object of the present invention resides in provision of a laser processing apparatus to which information necessary for processing of a wafer can be set readily.

In accordance with an aspect of the present invention, there is provided a laser processing apparatus wherein a laser beam of a wavelength which passes through a wafer having a surface on which a plurality of devices are disposed is irradiated along a schedule division line to separate the adjacent devices from each other to form a modification layer which continuously extends in a given length in the inside of the wafer, including a chuck table configured to hold a wafer thereon, laser beam irradiation means for irradiating the laser beam on the wafer held on the chuck table, moving means for moving the chuck table and the laser beam irradiation means relative to each other in a processing feeding direction and an indexing feeding direction, display means for displaying a picked up image obtained by image pickup of the wafer held on the chuck table, inputting means for inputting a processing condition for processing of the wafer, and storage means for storing the processing condition inputted by the inputting means, a mark portion being displayed in an overlapping relationship with the picked up image on the display means, coordinates which correspond to a desired position of the picked up image displayed on the display means when the mark portion is moved to the desired position of the picked up image being stored as a start point or an end point of a scheduled division line, along which the modification layer is to be formed, into the storage means.

In the laser processing apparatus according to the present invention, a mark portion is displayed in an overlapping relationship with a picked up image on the display means. Thus, by moving the mark portion to a desired position of the picked up image displayed on the display means, coordinates corresponding to the desired position of the picked up image are stored as a start point or an end point of a scheduled division line, along which a modification layer continuing in a given length is to be formed, into the storage means. Therefore, information relating to the scheduled division line along which a modification layer is to be formed can be set visually. In short, with the laser processing apparatus of the present invention, information necessary for wafer processing can be set readily.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
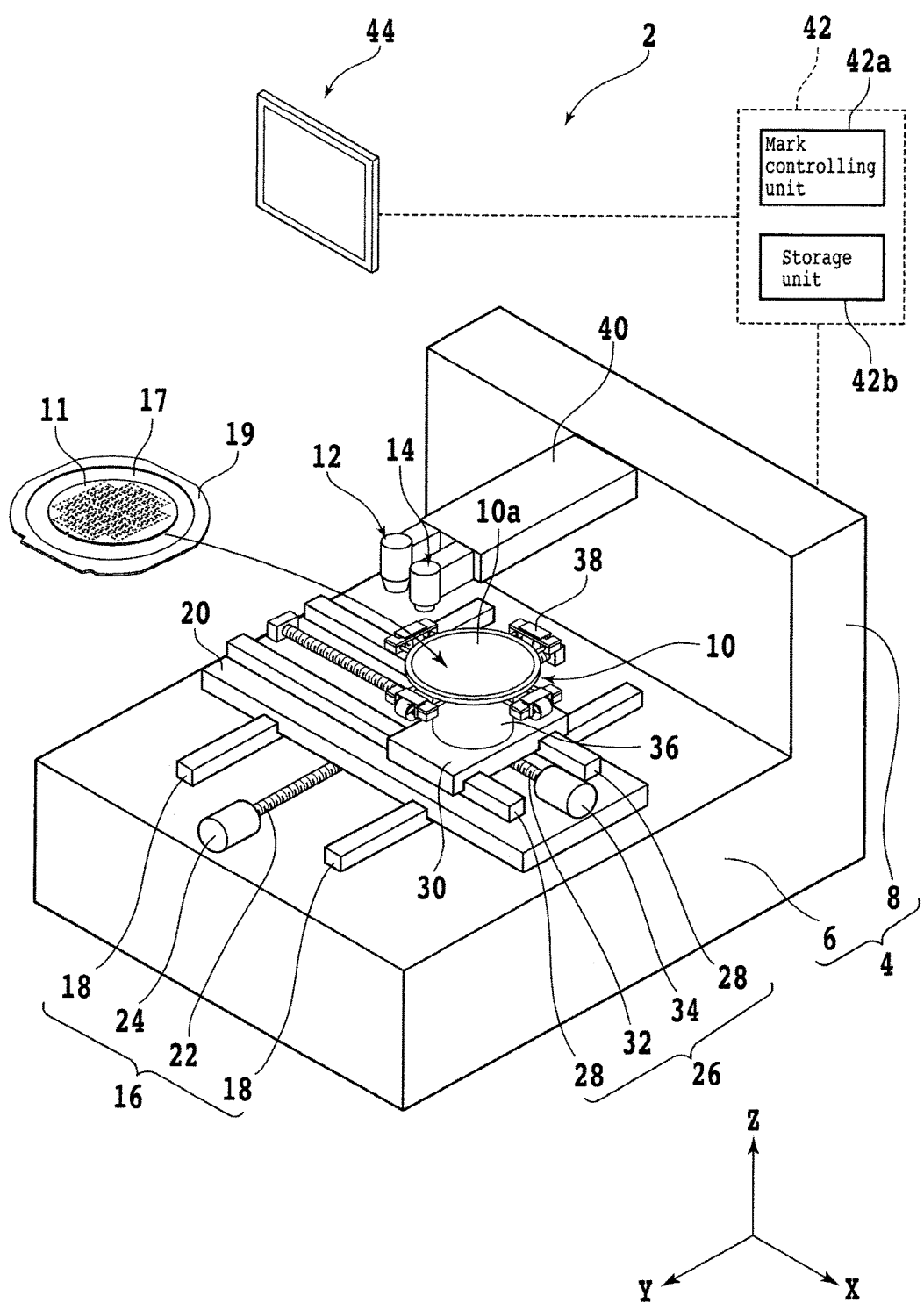
FIG. 1 is a view schematically depicting an example of a configuration of a laser processing apparatus.

An embodiment of the present invention is described with reference to the accompanying drawings. FIG. 1 is a view schematically depicting an example of a configuration of a laser processing apparatus according to the present embodiment. As depicted in FIG. 1, the laser processing apparatus 2 includes a base 4 which supports structural elements. The base 4 includes a rectangular parallelepiped-like base portion 6 and a wall portion 8 extending upwardly at a rear end of the base portion 6. A chuck table 10 is disposed on an upper face of the base portion 6 such that it sucks and retains a wafer 11 thereon with a protective tape 17 interposed therebetween. A laser processing head (laser beam irradiation means) 12 is provided above the chuck table 10 such that it irradiates a laser beam toward the wafer 11. Further, a camera 14 is provided at a position adjacent the laser processing head 12 such that it picks up an image regarding the wafer 11.

A Y-axis moving unit (indexing feeding means, moving means) 16 for moving the chuck table 10 in a Y-axis direction (indexing feeding direction) is provided below the chuck table 10. The Y-axis moving unit 16 includes a pair of Y-axis guide rails 18 fixed to the upper face of the base portion 6 in parallel to the Y-axis direction. A Y-axis moving table 20 is provided for sliding movement on the Y-axis guide rails 18. A nut portion (not depicted) is provided on the reverse face side (lower face side) of the Y-axis moving table 20, and a Y-axis ball screw 22 is screwed in parallel to the Y-axis guide rails 18 in the nut portion. A Y-axis pulse motor 24 is connected to one end portion of the Y-axis ball screw 22. If the Y-axis ball screw 22 is rotated by the Y-axis pulse motor 24, then the Y-axis moving table 20 moves in the Y-axis direction along the Y-axis guide rails 18.

An X-axis moving unit (processing feeding means, moving means) 26 for moving the chuck table 10 in an X-axis direction (processing feeding direction) orthogonal to the Y-axis direction is provided on the surface side (upper face side) of the Y-axis moving table 20. The X-axis moving unit 26 includes a pair of X-axis guide rails 28 fixed to an upper face of the Y-axis moving table 20 in parallel to the X-axis direction. An X-axis moving table 30 is provided for sliding movement on the X-axis guide rails 28. A nut portion (not depicted) is provided on a reverse face side (lower face side) of the X-axis moving table 30, and an X-axis ball screw 32 is screwed in parallel to the X-axis guide rails 28 in the nut portion. An X-axis pulse motor 34 is connected to one end portion of the X-axis ball screw 32. If the X-axis ball screw 32 is rotated by the X-axis pulse motor 34, then the X-axis moving table 30 moves in the X-axis direction along the X-axis guide rails 28.

A support base 36 is provided on the surface side (upper face side) of the X-axis moving table 30. The chuck table 10 is disposed at an upper portion of the support base 36. The chuck table 10 is connected to a rotational driving source (not depicted) provided below and rotates around a Z-axis. Four clamps 38 are provided around the chuck table 10 such that they hold and fix an annular frame 19, which is for supporting the wafer 11, from four sides. The surface of the chuck table 10 forms a holding face 10a which sucks and retains the wafer 11 thereon through the protective tape 17 applied to the wafer. A negative pressure of a suction source (not depicted) acts on the holding face 10a through a flow path (not depicted) formed in the inside of the chuck table 10 so as to generate suction force for sucking the protective tape 17.

A support arm 40 is provided on a front face at an upper portion of the wall portion 8 and extends forwardly, and the laser processing head 12 and the camera 14 are disposed at a tip end portion of the support arm 40. The laser processing head 12 includes a laser oscillator (not depicted) for oscillating a laser beam having a wavelength which passes through the wafer 11, and a condenser (not depicted) for condensing a laser beam to the inside of the wafer 11 held on the chuck table 10. The laser processing head 12 condenses a laser beam to the inside of the wafer 11 to form a modification layer by multiphoton absorption. The camera 14 includes, for example, an image pickup device for detecting light in an infrared region which is less likely to be absorbed by the wafer 11, and picks up an image of the wafer 11 from above. A picked up image formed by the image pickup is used for setting of a processing condition or the like.

The chuck table 10, laser processing head 12, camera 14, Y-axis moving unit 16, X-axis moving unit 26 and so forth are connected to a control apparatus (control means) 42. The control apparatus 42 controls operation of the elements described above in accordance with a processing condition and so forth set through a touch type display panel (displaying means, inputting means) 44 used as a user interface. Further, the control apparatus 42 causes the display panel 44 to display a picked up image and display a mark (mark portion) overlapping with the picked up image. For example, by moving the mark to a desired position of the displayed picked up image, a region to which a laser beam is to be irradiated can be set. The control apparatus 42 includes a mark controlling unit 42a for controlling a mark, and a storage unit (storage means) 42b for storing various kinds of information therein. Particular functions and so forth are hereinafter described in detail.

Figure 2:
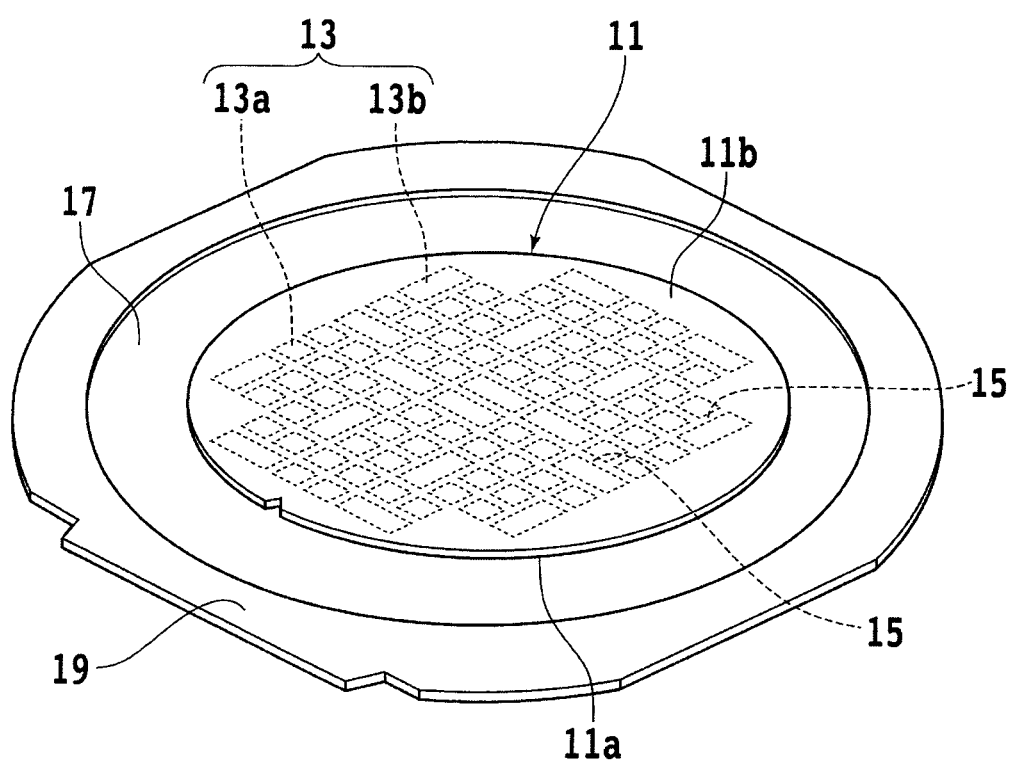
FIG. 2 is a perspective view schematically depicting an example of a configuration of a wafer.
Figure 3:
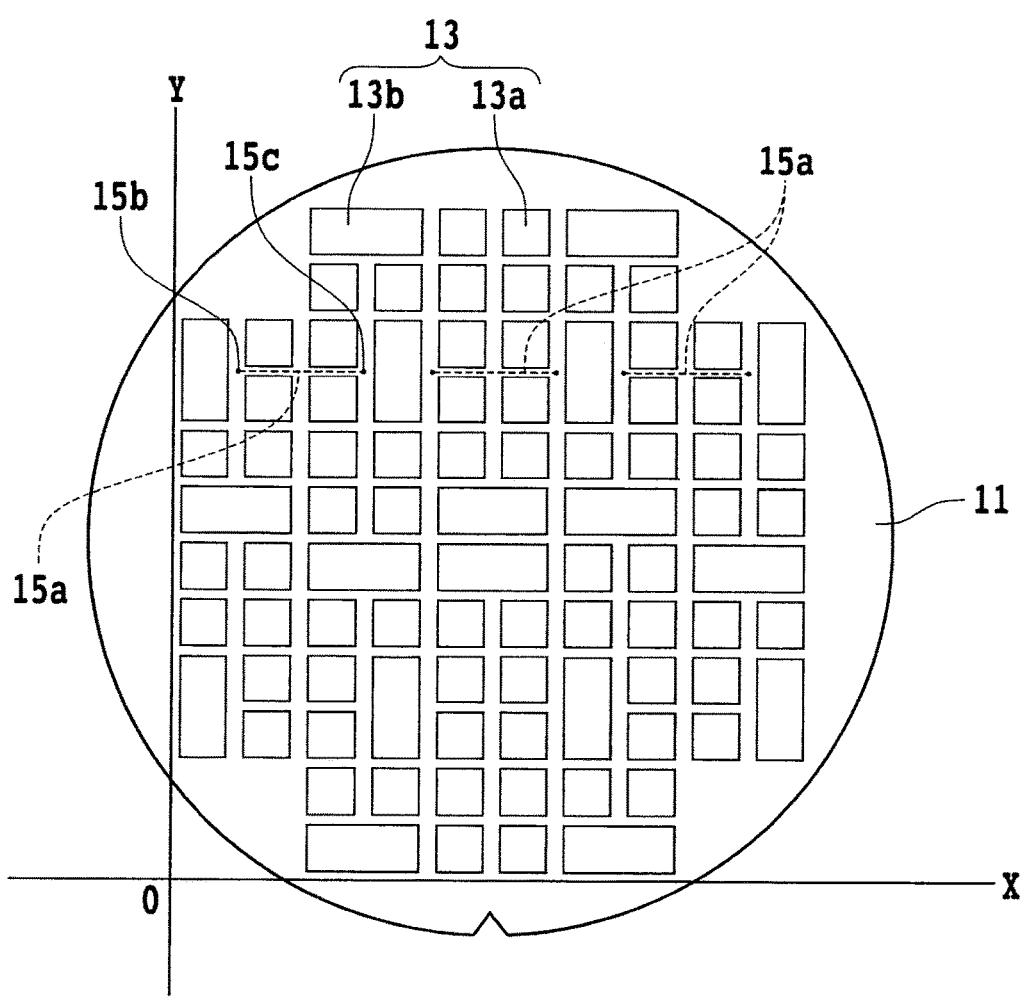
FIG. 3 is a top plan view schematically depicting an example of a configuration of the wafer.

Now, a laser processing method for forming a modification layer serving as a start point of division using the laser processing apparatus 2 of the present embodiment is described. FIG. 2 is a perspective view schematically depicting an example of a configuration of the wafer 11 to be processed by the laser processing apparatus 2 of the present embodiment, and FIG. 3 is a top plan view schematically depicting an example of a configuration of the wafer 11. As depicted in FIG. 2, the wafer 11 in the present embodiment is a so-called multi-project type semiconductor wafer, and a plurality of devices 13 (first devices 13a and second devices 13b) having shapes and sizes different from each other are arranged on the surface 11a side of the wafer 11. The devices 13 positioned adjacent each other are separated from each other by a region having a predetermined width, and a scheduled division line (street) 15 for dividing the wafer 11 is defined by the region. Further, the protective tape 17 for protecting the devices 13 is applied to the surface 11a side of the wafer 11. An outer peripheral portion of the protective tape 17 is fixed to the annular frame 19. In other words, the wafer 11 is supported on the frame 19 through the protective tape 17.

In the laser processing method in the present embodiment, the surface 11a side (protective tape 17) of the wafer 11 is sucked and held by the chuck table 10 first. Consequently, a rear face 11b side of the wafer 11 is exposed upwardly. Then, an image of the wafer 11 held on the chuck table 10 is picked up by the camera 14, and the scheduled division line 15 of the wafer 11 is adjusted so as to be parallel to the X-axis direction or the Y-axis direction on the basis of the formed picked up image.

As described above, the shapes and the sizes of the first devices 13a and the second devices 13b are different from each other. In particular, the size of the second devices 13b is greater than that of the first devices 13a. Therefore, a scheduled division line 15 that does not continue from one end to the other end of the wafer 11 appears. For example, as depicted in FIG. 3, a short scheduled division line 15a extending in the X-axis direction is disposed at a position sandwiched by the second devices 13b. In order to form a modification layer along such a short scheduled division line 15a as just described, it is necessary to set a start point 15b and an end point 15c of the scheduled division line 15a to the laser processing apparatus 2.

Figure 4A:
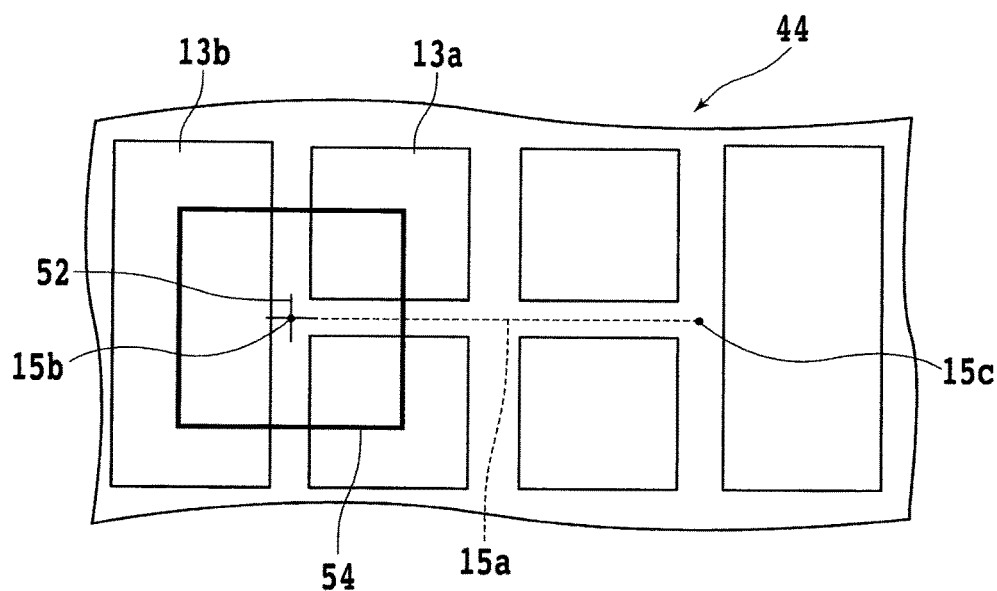
FIGS. 4A and 4B are views schematically depicting a procedure for setting a start point and an end point of a scheduled division line to the laser processing apparatus.
Figure 4B:
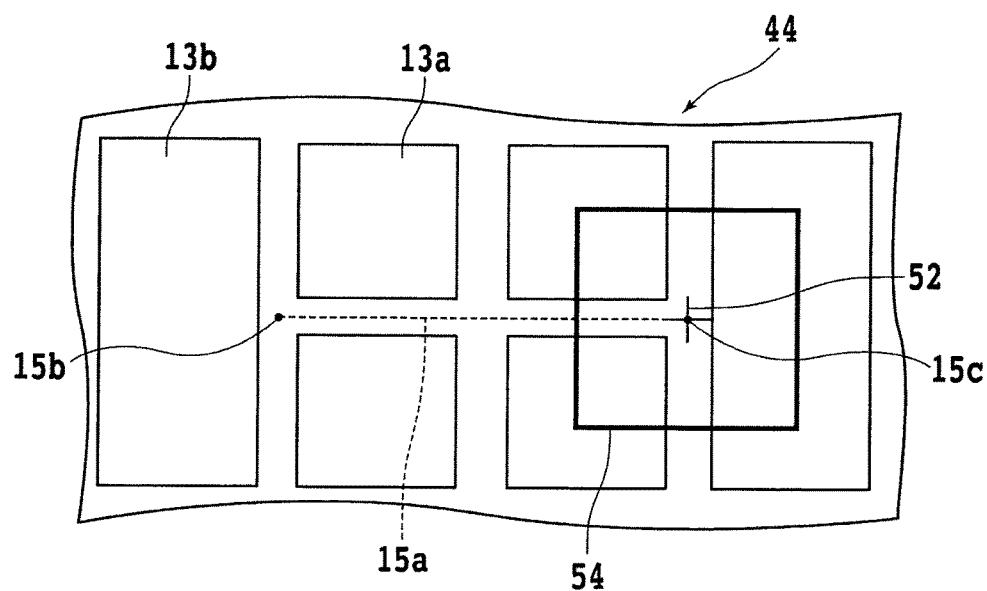

Therefore, in the laser processing method in the present embodiment, a start point 15b and an end point 15c of each scheduled division line 15a are set to the laser processing apparatus 2 using the picked up image formed by picking up an image of the wafer 11. FIGS. 4A and 4B are views schematically depicting a procedure for setting a start point 15*b* and an end point 15*c* of the scheduled division line 15*a* to the laser processing apparatus 2. As depicted in FIGS. 4A and 4B, first, an image of a region including the start point 15*b* and the end point 15*c* of the scheduled division line 15*a* is picked up, and the picked up image is displayed on the display panel 44. When the picked up image is displayed on the display panel 44, the mark controlling unit 42*a* of the controlling apparatus 42 causes the display panel 44 to display a mark (mark portion) 52 which designates a desired position in the picked up image. The mark 52 is, for example, a cross mark and is displayed so as to be visually observed in a state in which it is overlapped with the picked up image. However, the shape and the size of the mark 52 are not specifically limited. Further, in order to facilitate confirmation of the location of the mark 52, a different mark (mark portion) 54 surrounding the mark 52 or the like may be displayed together with the mark 52.

In the state in which the mark 52 overlapping with the picked up image is displayed, an operator would touch, for example, with the display panel 44 to move the mark 52 to a position corresponding to the start point 15*b* of the scheduled division line 15 as depicted in FIG. 4A. Thereafter, for example, in an icon for start point setting displayed on the display panel 44 is touched, then the mark controlling unit 42*a* of the controlling apparatus 42 converts the position of the picked up image designated by the mark 52 into XY coordinates for the laser processing apparatus 2. The converted XY coordinates are stored as a position of the start point 15*b* into the storage unit 42*b*. Further, the operator would move the mark 52 to a position corresponding to the end point 15*c* of the scheduled division line 15 as depicted in FIG. 4B. Thereafter, for example, if an icon for end point setting displayed on the display panel 44 is touched, then the mark controlling unit 42*a* converts the position of the picked up image designated by the mark 52 into the XY coordinates for the laser processing apparatus 2. The converted XY coordinates are stored as the position of the end point 15*c* into the storage unit 42*b*. In this manner, the operator can set the start point 15*b* and the end point 15*c* of the scheduled division line 15*a* which continues in a predetermined length to the laser processing apparatus 2. After the start points 15*b* and end points 15*c* of all scheduled division lines 15*a* are set, a formation step of a modification layer is started.

Figure 5A:
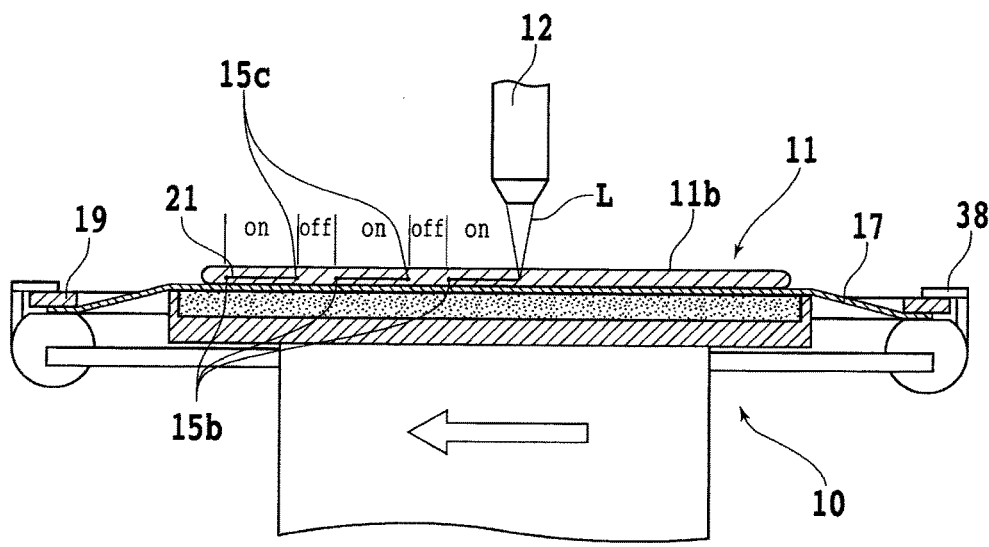
FIGS. 5A and 5B are side elevational views, partly in section, schematically depicting a formation process of a modification layer.
Figure 5B:
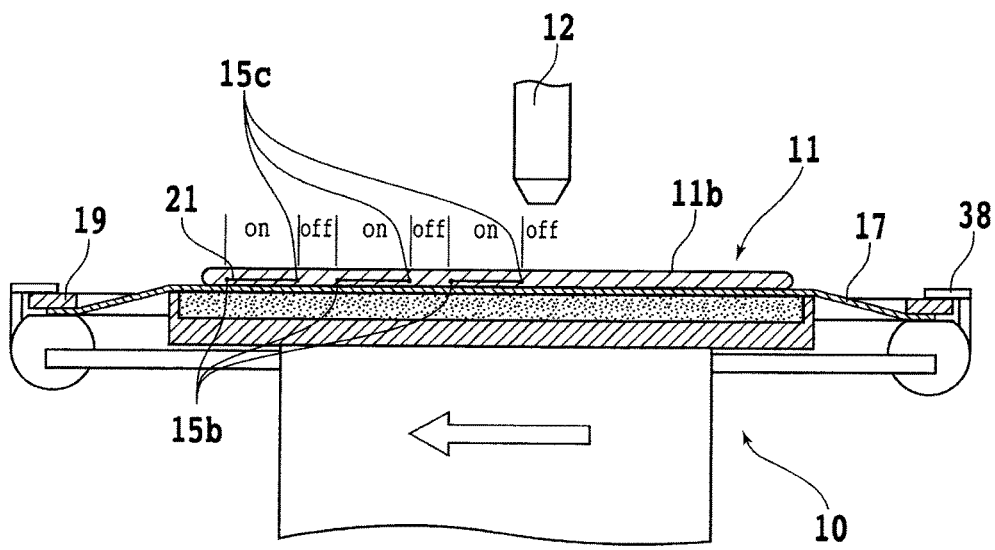

FIGS. 5A and 5B are side elevational views, partly in section, schematically depicting the formation step of a modification layer. As depicted in FIGS. 5A and 5B, at the formation step of a modification layer, the laser processing head 12 is positioned above a wafer 11 held on the chuck table 10 first. Then, while the chuck table 10 and the laser processing head 12 are moved relative to each other, a laser beam L is irradiated upon the wafer 11. The laser beam L is oscillated from a laser medium such as, for example, a YAG or a YVO4 and is irradiated on the rear face 11*b* side of the wafer 11. Further, the laser beam L is switched between irradiation (on) and non-irradiation (off) thereof in accordance with a start point 15*b* and an end point 15*c* set in such a manner as described hereinabove. The focal point of the laser beam L is positioned in the inside of the wafer 11. In a region upon which the laser beam L is irradiated, a modification layer 21 is formed as depicted in FIG. 5A. On the other hand, in a region upon which the laser beam L is not irradiated, the modification layer 21 is not formed as depicted in FIG. 5B. In this manner, with the laser processing method of the present embodiment, the modification layer 21 can be formed appropriately in accordance with the setting of the start point 15*b* and the end point 15*c*. It is to be noted that, where the wafer 11 is formed from silicon, preferably the laser beam L of a wavelength in the infrared region (for example, 1,064 nm) is used. By using the laser beam L of a wavelength which is less likely to be absorbed by the wafer 11 in this manner, the modification layer 21 which serves favorably as a start point of division can be formed in the inside of the wafer 11.

As described above, in the laser processing apparatus 2 according to the present embodiment, since a mark (mark portion) 52 is displayed in an overlapping relationship with a picked up image on the display panel (display means) 44, by moving the mark 52 to a desired position on the picked up image displayed on the display panel 44, coordinates corresponding to the desired position of the picked up image are stored as a start point 15*b* or an end point 15*c* of a scheduled division line 15*a* along which a modification layer 21 which is continuous in a predetermined length is to be formed into the storage unit (storage means) 42*b*. Therefore, information relating to the scheduled division line 15*a* can be set visually.

Figure 6A:
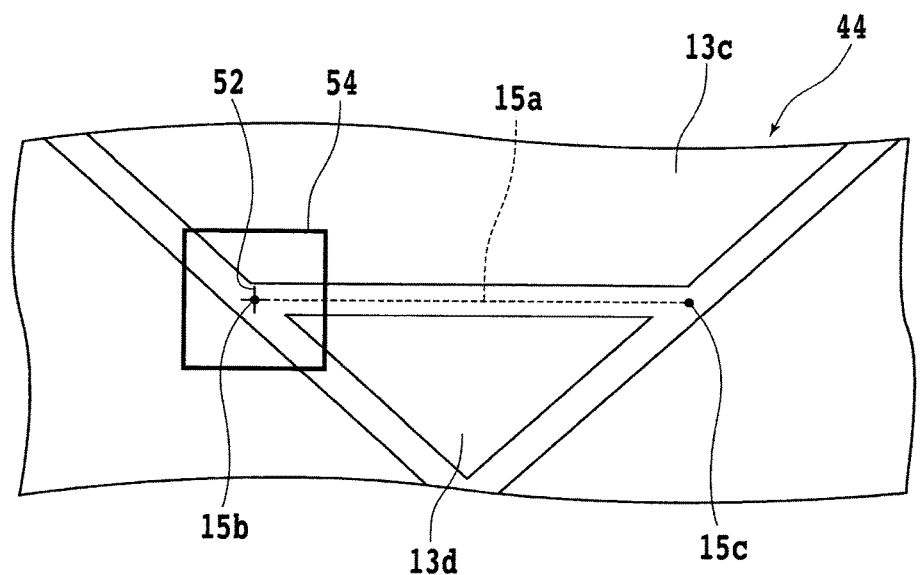
FIGS. 6A and 6B are views schematically depicting a procedure for setting a start point and an end point of a scheduled division line to the laser processing apparatus when a wafer according to a modification is to be processed.
Figure 6B:
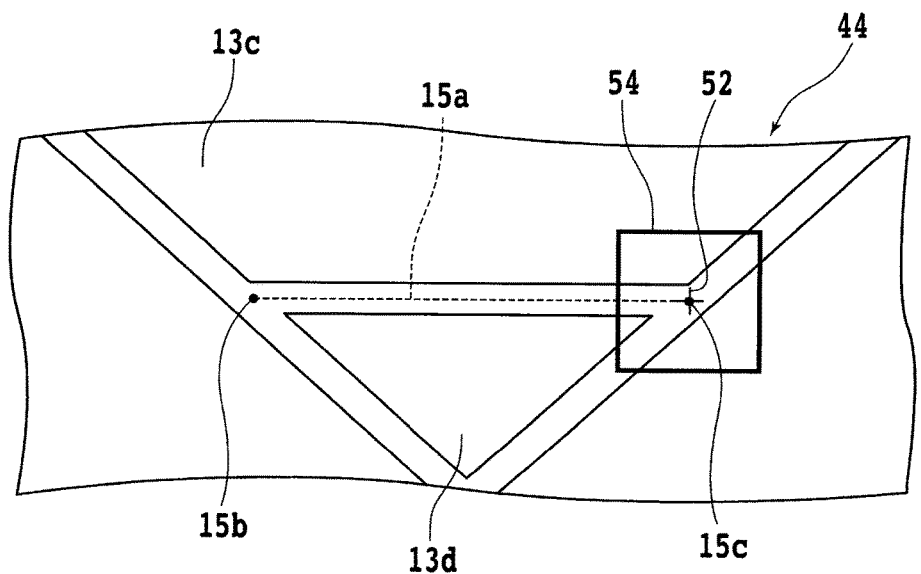

It is to be noted that the present invention is not limited to the foregoing description of the embodiment but can be carried out in various modified manners. For example, the laser processing apparatus 2 according to the present invention can be used also when a wafer of a form different from that in the embodiment described above is processed. FIGS. 6A and 6B are views schematically depicting a procedure for setting a start point 15*b* and an end point 15*c* of a scheduled division line 15*a* to the laser processing apparatus 2 when a wafer according to a modification is processed. As depicted in FIGS. 6A and 6B, on the wafer according to the modification, a modified device 13*c* whose corner portion is cut away in such a manner as to be chamfered and an end piece 13*d* corresponding to the cutaway corner portion are arrayed. In other words, with the present wafer, a plurality of scheduled division lines do not cross orthogonally with each other.

Also in this case, an image of regions including a start point 15*b* and an end point 15*c* of a scheduled division line 15*a* which is continuous in a predetermined length is picked up, and the picked up image is displayed on the display panel 44 as depicted in FIGS. 6A and 6B. Further, the mark controlling unit 42*a* of the control apparatus 42 causes the mark (mark portion) 52 to be displayed on the display panel 44. In the state in which the mark 52 is displayed in an overlapping relationship with the picked up image, the operator would, for example, touch with the display panel 44 to move the mark 52 to a position corresponding to the start point 15*b* of the scheduled division line 15 as depicted in FIG. 6A. Thereafter, if the operator touches, for example, with a start point setting icon displayed on the display panel 44, then the mark controlling unit 42*a* of the control apparatus 42 converts the position of the picked up image designated by the mark 52 into XY coordinates of the laser processing apparatus 2. The XY coordinates converted in this manner are stored as a position of the start point 15*b* into the storage unit 42*b*. Further, as depicted in FIG. 6B, the operator would move the mark 52 to a position corresponding to the end point 15*c* of the scheduled division line 15. Thereafter, if the operator touches, for example, with an end position setting icon displayed on the display panel 44, then the mark controlling unit 42*a* converts the position of the picked up image designated by the mark 52 into XY coordinates of the laser processing apparatus 2. The XY coordinates converted in this manner are stored as a position of the end point 15*c* into the storage unit 42*b*. In this manner, also when the wafer according to the modification is processed, the operator would set a start point 15*b* and an end point 15c for a scheduled division line 15a which is continuous in a predetermined length. After the start point 15b and the end point 15c are set for all such scheduled division lines 15a, a modification layer formation step similar to that in the embodiment described hereinabove is started.

Further, although, in the embodiment described hereinabove, the end point 15c is set after the start point 15b of the scheduled division line 15a is set, the start point 15b may be set after the end point 15c is set.

The present invention is not limited to the details of the above descried preferred embodiment. The scope of the invention is defined by the appended claims and all changes and modifications as fall within the equivalence of the scope of the claims are therefore to be embraced by the invention.

What is claimed is:

1. A laser processing apparatus wherein a laser beam of a wavelength which passes through a wafer having a surface on which a plurality of devices are disposed is irradiated along a schedule division line to separate the adjacent devices from each other to form a modification layer which continuously extends in a given length in the inside of the wafer, comprising:

a chuck table configured to hold a wafer thereon;

laser beam irradiation means for irradiating the laser beam on the wafer held on the chuck table;

moving means for moving the chuck table and the laser beam irradiation means relative to each other in a processing feeding direction and an indexing feeding direction;

display means for displaying a picked up image obtained by image pickup of the wafer held on the chuck table;

inputting means for inputting a processing condition for processing of the wafer; and a storage device that stores the processing condition inputted by the inputting means;

a mark portion being displayed in an overlapping relationship with the picked up image on the display means;

coordinates which correspond to a desired position of the picked up image displayed on the display means when the mark portion is moved to the desired position of the picked up image being stored as a start point or an end portion of a scheduled division line, along which the modification layer is to be formed, into the storage device.

* * * * *